US010127991B2

(12) United States Patent
Tanzawa

(10) Patent No.: US 10,127,991 B2
(45) Date of Patent: Nov. 13, 2018

(54) THREE DIMENSIONAL MEMORY DEVICE WITH ACCESS SIGNAL TRIGGERING FROM VOLTAGE PUMP OUTPUT LEVELS

(71) Applicant: Intel Corporation, Santa Clara, CA (US)

(72) Inventor: Toru Tanzawa, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/239,624

(22) Filed: Aug. 17, 2016

(65) Prior Publication Data
US 2018/0053558 A1 Feb. 22, 2018

(51) Int. Cl.
*G11C 5/14* (2006.01)
*G11C 11/34* (2006.01)
*G11C 16/30* (2006.01)
*G11C 16/34* (2006.01)
*G06F 3/06* (2006.01)

(52) U.S. Cl.
CPC ............ *G11C 16/30* (2013.01); *G06F 3/0625* (2013.01); *G06F 3/0655* (2013.01); *G06F 3/0688* (2013.01); *G11C 16/34* (2013.01)

(58) Field of Classification Search
None
See application file for complete search history.

(56) References Cited

U.S. PATENT DOCUMENTS

| 9,361,993 B1* | 6/2016 | Chen ...................... G11C 16/14 |
| 2010/0302859 A1* | 12/2010 | Yun ......................... G11C 16/10 365/185.19 |
| 2011/0205829 A1* | 8/2011 | Iida ...................... G11C 11/4085 365/230.06 |
| 2013/0128683 A1* | 5/2013 | Kim ........................ G11C 5/147 365/226 |
| 2014/0146612 A1* | 5/2014 | Helm ....................... G11C 7/18 365/185.18 |

OTHER PUBLICATIONS

Tanzawa, Toru, et al., "A Quick Boosting Charge Pump Circuit for High Density and Low Voltage Flash Memories," 1994 IEEE Symposium on VLSI Circuits Digest of Technical Papers, pp. 65-66.
(Continued)

*Primary Examiner* — Harry W Byrne
*Assistant Examiner* — Sultana Begum
(74) *Attorney, Agent, or Firm* — Compass IP Law PC

(57) ABSTRACT

A method is described. The method includes, within a semiconductor memory device comprising a three dimensional storage cell array, pumping a voltage and detecting a level of the pumped voltage. The method also includes causing a voltage level of an access control signal that is applied to the three dimensional storage cell array and whose voltage is derived from the pumped voltage to change in response to the detecting of the level of the pumped voltage. An apparatus is also described. The apparatus includes a semiconductor memory device comprising a three dimensional storage cell array. The semiconductor memory device includes a voltage pumping circuit to produce a pumped voltage, a waveform shaping circuit and a controller circuit.

24 Claims, 11 Drawing Sheets

(56) References Cited

OTHER PUBLICATIONS

Im, Jae-Woo, et al., "7.2 A 128Gb 3b/cell V-NAND Flash Memory with 1Gb/s I/O Rate," 2015 IEEE International Solid-State Circuits Conference, pp. 130-131.
Katsumata, Ryota, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Jang, Jaehoon, et al., "Vertical Cell Array using TCAT (Terabit Cell Array Transistor) Technology for Ultra High Density NAND Flash Memory," 2009 Symposium on VLSI Technology Digest of Technical Papers, pp. 192-193.
Kim, Jiyoung, et al., "Novel Vertical-Stacked-Array-Transistor (VSAT) for ultra-high-density and cost-effective NAND Flash memory devices and SSD (Solid State Drive)," 2009 Symposium on VLSI Technology Digest of Technical Papers, pp. 186-187.
Kim, Wonjoo, et al., "Multi-Layered Vertical Gate NAND Flash Overcoming Stacking Limit for Terabit Density Storage," 2009 Symposium on VLSI Technology Digest of Technical Papers, pp. 188-189.
Park, Ki-Tae, et al., "Three-Dimensional 128Gb MLC Vertical NAND flash-Memory with 24-WL Stacked Layers and 50MB/s High-Speed Programming,"2014 IEEE International Solid-State Circuits Conference, pp. 334-335.
Choi, Jungdal, et al., "3D Approaches for Non-volatile Memory," 2011 Symposium on VLSI Technology Digest of Technical Papers, pp. 178-179.

\* cited by examiner

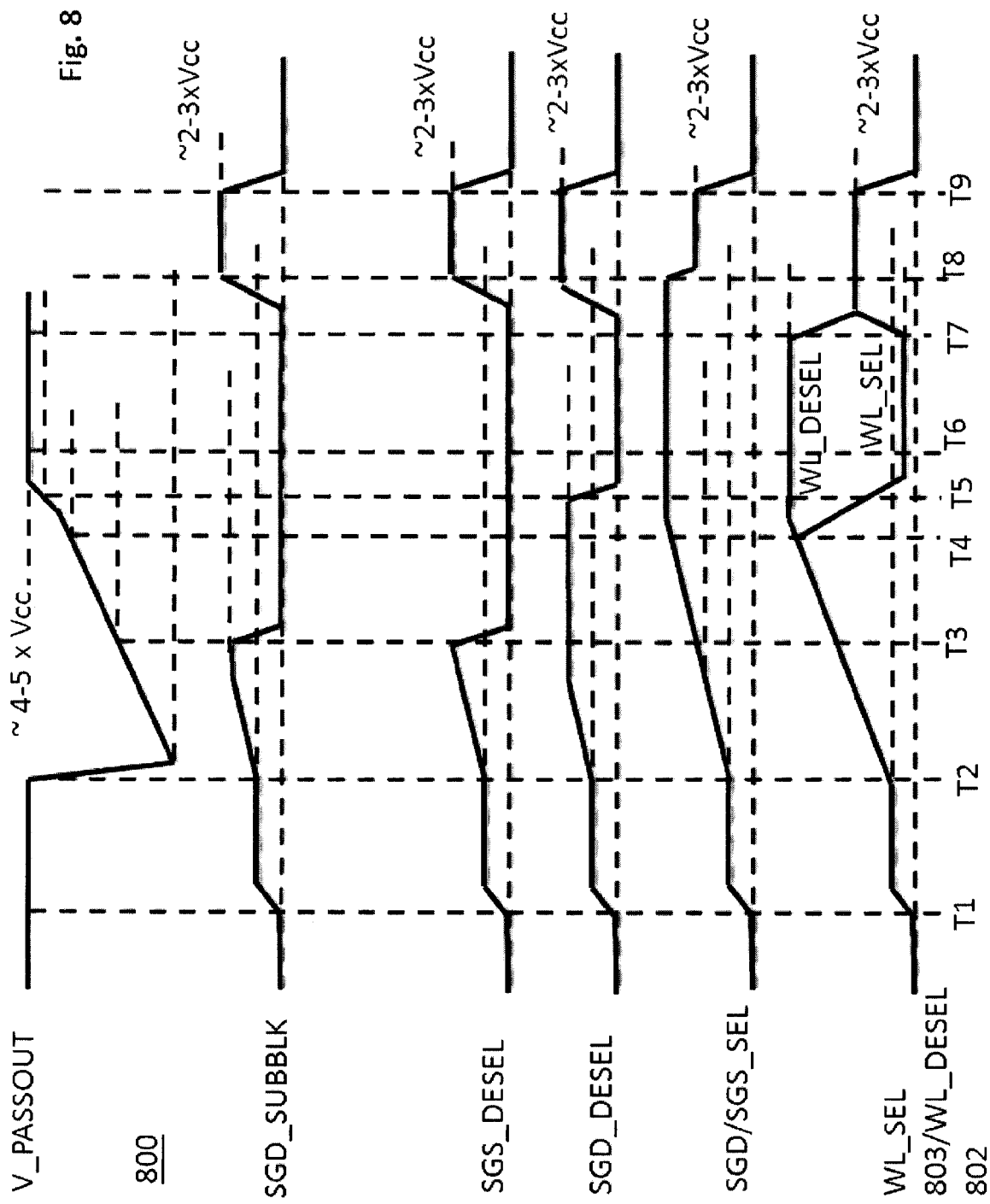

US 10,127,991 B2

THREE DIMENSIONAL MEMORY DEVICE WITH ACCESS SIGNAL TRIGGERING FROM VOLTAGE PUMP OUTPUT LEVELS

FIELD OF THE INVENTION

The field of the invention pertains generally to the semiconductor device arts, and, more specifically, to a three dimensional memory device with access signal triggering from voltage pump output levels.

BACKGROUND

The emergence of mobile devices has created keen interest amongst non-volatile semiconductor memory manufacturers to increase the densities of their devices. Generally, mobile devices do not make use of disk drives, but instead favor use of semiconductor based nonvolatile storage devices. Historically, however, semiconductor storage devices do not have the same storage density as disk drives.

In order to bring the storage densities of semiconductor memories closer to or beyond disk drives, non-volatile memory device manufacturers are developing three dimensional memory technologies. In the case of three dimensional memory technologies, individual storage cells are vertically stacked on top of one another within the storage device. Three dimensional memory devices may therefore provide a mobile device with disk drive like storage density in a much smaller package, cost and power consumption envelope (and even larger systems such as desktop or server systems may benefit from increased semiconductor based non volatile storage densities). However, the manufacture of three dimensional memory devices raises new technology challenges.

BRIEF DESCRIPTION OF THE DRAWINGS

A better understanding of the present invention can be obtained from the following detailed description in conjunction with the following drawings, in which:

FIG. 8 shows an embodiment of an improved three dimensional NAND FLASH reset signaling approach;

DETAILED DESCRIPTION

Figure 1:
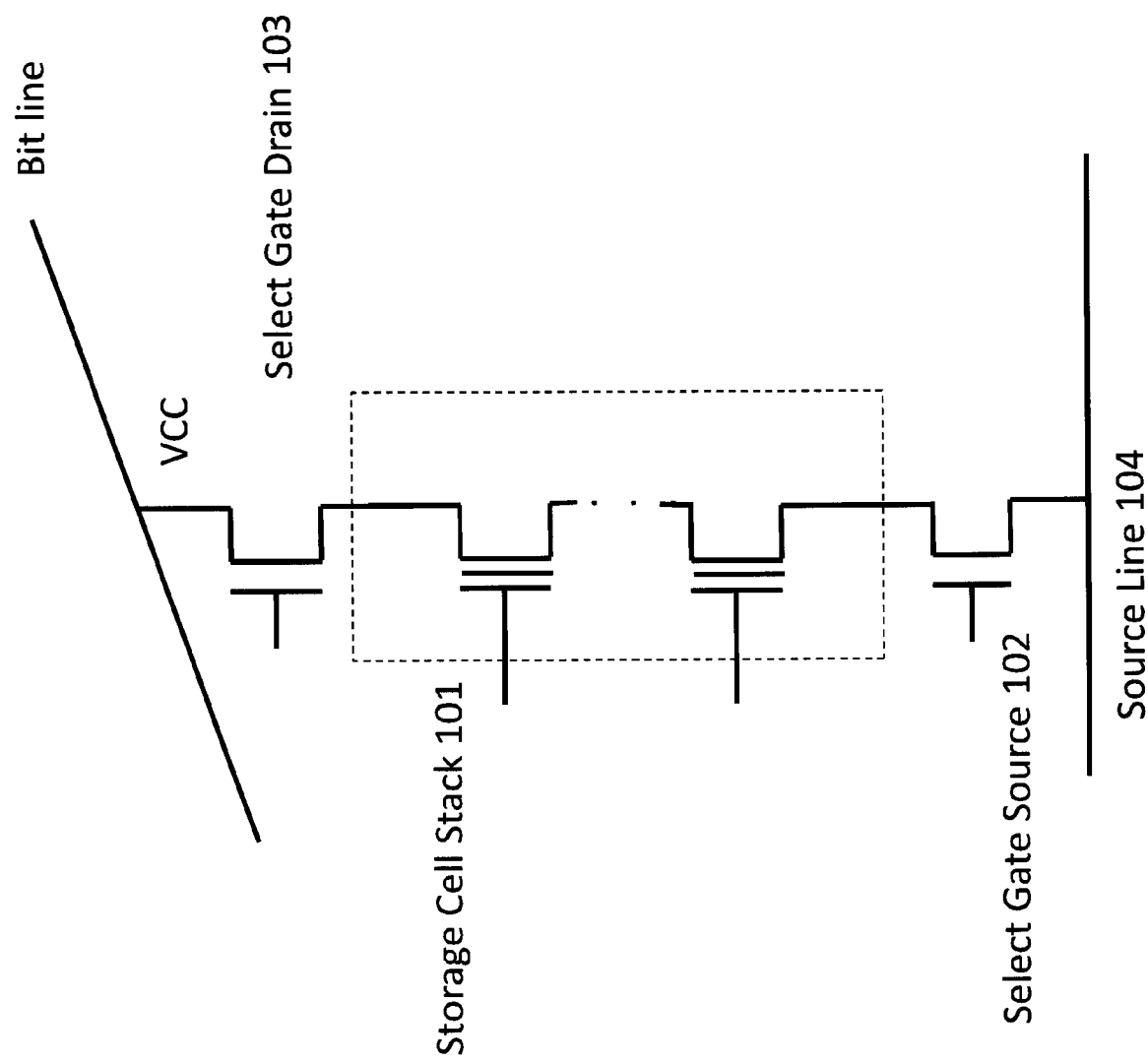
FIG. 1 shows an embodiment of a circuit schematic for a three dimensional NAND FLASH memory.

FIG. 1 shows a circuit schematic for the storage cell region of a three dimensional NAND FLASH memory. As observed in FIG. 1, the circuit includes a stack of NAND FLASH storage cells 101 coupled between a select gate source transistor 102 and a select gate drain transistor 103. The select gate source transistor 102 is coupled to a source line 104. The stack of storage cells 101 may be implemented as a three dimensional stack of FLASH transistors that are monolithically integrated as a three dimensional storage array on a semiconductor chip along with the select gate source and select gate drain transistors 102, 103 as well as other transistor devices (not shown) that help implement the NAND function of the storage cell (e.g., sense amplifiers, row decoders, address decoders, etc.).

Figure 2:
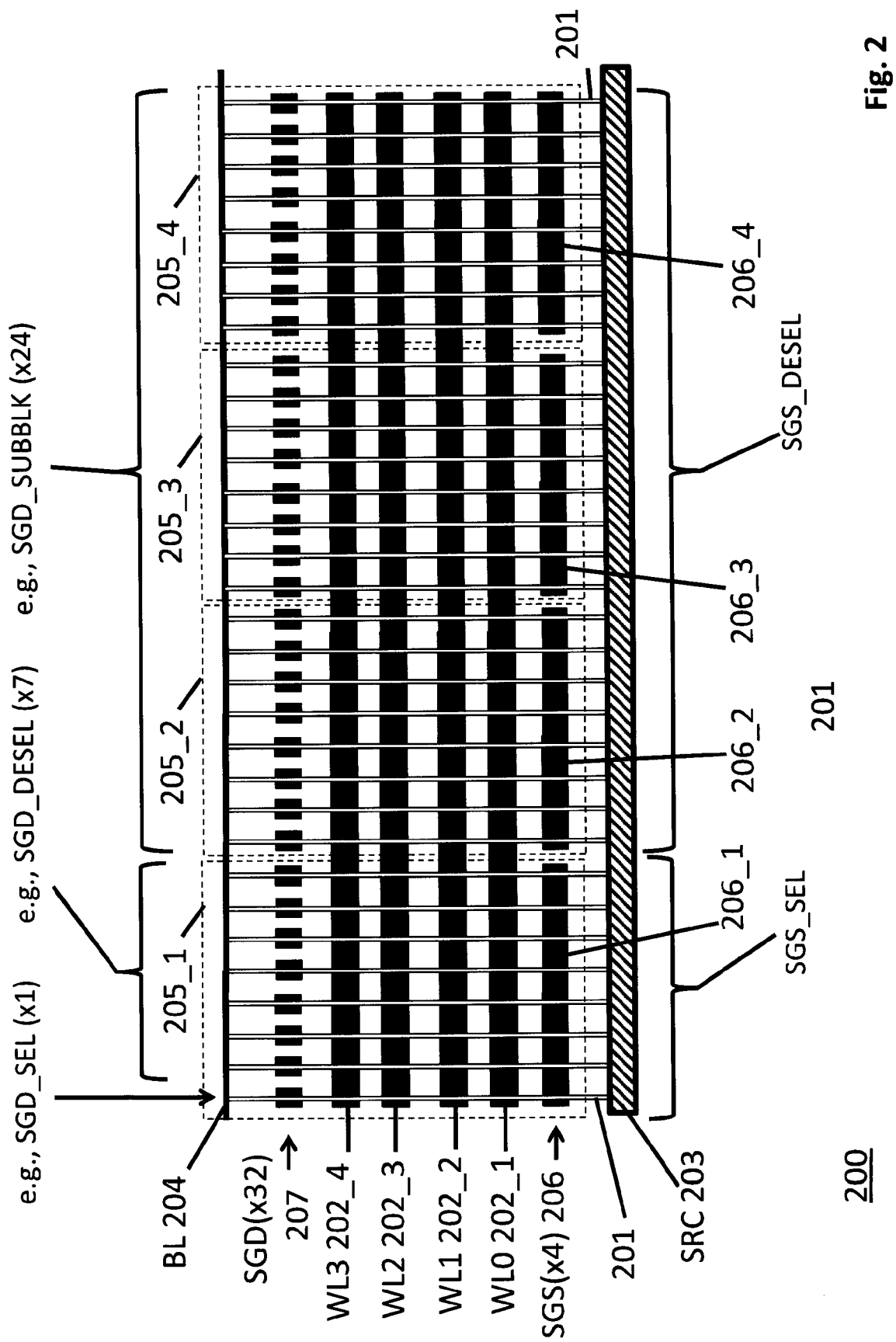
FIG. 2 shows an embodiment of a cross section of a three dimensional NAND FLASH memory.

FIG. 2 shows an exemplary embodiment 200 of the physical layout of a block of a three dimensional NAND FLASH storage cell array. Here, a complete NAND FLASH memory may comprise a plurality of such blocks. For example, a different block may be accessed for each respective bit of a word of data that is written into or read from the memory. Alternatively or in combination, different (e.g., higher order) address bits that are provided to the memory may be decoded to activate different subsets of blocks within the overall memory.

As observed in FIG. 2, the storage cell array block 200 includes a plurality of storage columns 201 that each contain a stack of storage cells (also referred to as a column or pillar) where each storage cell in a same stack corresponds to a different "level" of the stack (for drawing ease only the leftmost and rightmost stacks are labeled with reference number 201). Additionally, each level of the stack is coupled to a different word line and the same stack level across multiple stacks is coupled to a same word line. In the particular embodiment of FIG. 2, each storage column contains four storage cells/levels in its respective stack. As such, four different word lines 202_1 through 202_4 that each mark a different respective level of the stacks is coupled across the stacks.

The physical layout of FIG. 2 also indicates that certain nodes of the generic storage cell design of FIG. 1 are shared within a block. For example, in the layout of FIG. 2, all storage cell stacks in the block share the same word lines 202_1 through 202_4, source node 203 and bit-line 204. Additionally, the block of FIG. 2 can be viewed as being composed of four different sub-blocks 205_1 through 205_4 where the columns of each respective sub-block share the same select gate source node. That is, in the embodiment of FIG. 2, the columns of sub-block 205_1 share same select gate source node 206_1, the columns of sub-block 205_2 share same select gate source node 206_2, the columns of sub-block 205_3 share same select gate source node 206_3 and the columns of sub-block 205_4 share same select gate source node 206_4. In an embodiment, each stack includes its own respective select gate source transistor but the gate nodes of these transistors are tied to the same node.

Other nodes of a storage cell stack, however, are not shared amongst the multiple storage cell stacks of the block. Besides the storage cells of the stacks themselves, note that each storage cell stack in the particular layout embodiment 200 of FIG. 2 has its own dedicated select gate drain node 207. That is, in an embodiment, each storage cell stack not only includes its own select gate drain transistor, bit also, the respective gate node of each such select gate drain transistor is individually controlled/driven and is not tied to the gate node of any other select gate drain transistor.

In order to access any particular storage cell within the block, such as the leftmost cell in FIG. 2 as an example, the select gate source node 206_1 of the targeted cell's sub-block is activated (SGS_SEL in FIG. 2) and the select gate source node of the other three sub-blocks in the block are deactivated (SGS_DESEL in FIG. 2). Likewise, the respective select gate drain node of each storage column in the three unselected sub-blocks is deactivated (SGD_SUBBLK in FIG. 2). Additionally, the select gate drain node of the targeted cell's storage column is activated (SGD_SEL in FIG. 2) while all other select gate drain node in the block are deactivated (SGD_DESEL in FIG. 2). Finally, the word line that is coupled to the targeted storage cell is activated (WL_SEL in FIG. 3) while the other word lines are deactivated (WL_DESEL in FIG. 3).

The sets of different nodes that require activation and de-activation combined with the sharing of some nodes (and the extent of such sharing where it exists) and the non sharing of other nodes result in a complicated application of control signals that are applied to the block in order to access a particular storage cell. The complications are further exacerbated by the desire to access any targeted storage cell relatively quickly in view of the realization that shared nodes can increase the node's parasitic capacitance which, in turn, can add propagation delay to any signal that attempts to activate or deactivate the shared node.

Figure 3:
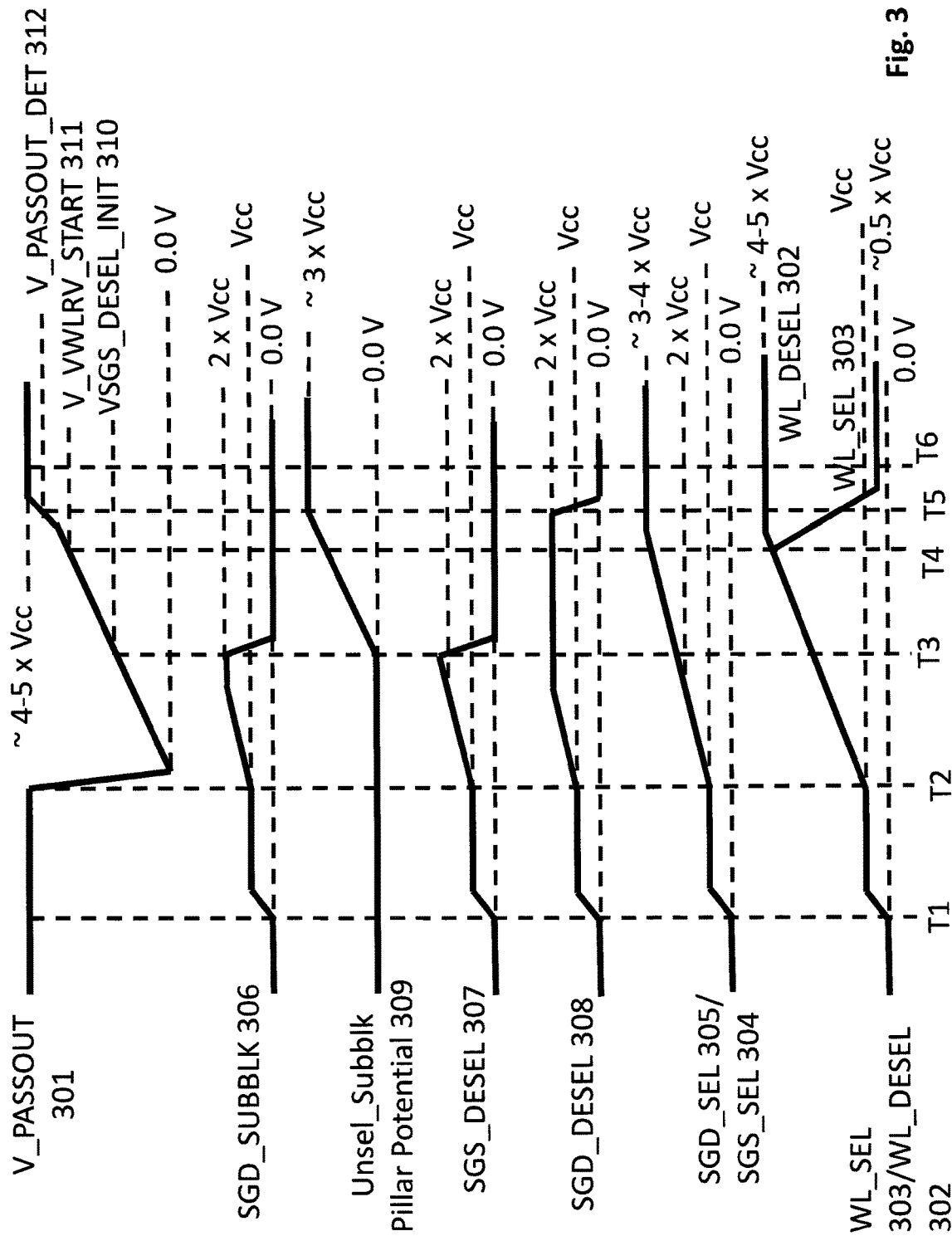
FIG. 3 shows an embodiment of an improved three dimensional NAND FLASH memory read access signaling approach that triggers signaling activity from voltage pump output levels.

FIG. 3 shows an embodiment of a control signaling sequence for accessing any particular storage cell for a read operation in a three dimensional storage cell array block such as the three dimensional storage cell array block 200 of FIG. 2.

As observed in FIG. 3, and as will be described in more detail below, a voltage pump circuit pumps a voltage level beyond the nominal VCC supply voltage to provide an elevated voltage level that is, e.g., 4 to 5 times VCC. For example, if the nominal VCC supply voltage is 1.8V, the voltage pump may provide an 8V supply voltage. The elevated voltage that is generated by the voltage pump is used to apply elevated voltage levels to various nodes in the storage cell block to properly access the targeted storage cell in an isolated fashion.

In the particular signaling embodiment of FIG. 3, the output of the voltage pump corresponds to the V_PASSOUT signal 301. In various embodiments, not only is the fully elevated voltage (e.g., 8V) applied to certain nodes within the block, but also, other lesser elevated voltages are also applied to other nodes within the block. Here, the lesser elevated voltages may be sourced from the voltage pump and therefore may exceed VCC but may not reach the full 4 to 5 times VCC level. For example, one such elevated voltage may reach a level of 3 to 4 times VCC (e.g., 5 or 6V) while another elevated voltage may reach a level of approximately 2 times VCC (3 or 4V).

FIG. 3 shows an example. Here, the actual accessing of the targeted storage cell occurs after time T6. As observed in FIG. 3, after time T6, the deselected word lines (WL_SEL 302) are provided the fully elevated voltage of approximately 4 to 5 times VCC. By contrast, the select gate source node of the sub-block having the targeted storage cell (SGS_SEL 304) and the select gate drain of the storage cell stack having the targeted storage cell (SGD_SEL 305) are provided a lesser elevated voltage level of 3 to 4 times VCC.

Further still, at time T3 (prior to the actual storage cell access that occurs after time T6), the voltage levels of the select gate drain nodes of the sub-blocks that do not contain the targeted storage cell (SGD_SUBBLK 306), the select gate source nodes of the sub-blocks that do not contain the targeted storage cell (SGS_DESEL 307) and the respective select gate drain nodes of the storage cell stacks that do not contain the targeted storage cell but that reside within the sub-block that contains the targeted storage cell (SGD_DESEL 308) each reach a lesser elevated level of approximately 2 times VCC. Again, each of these lesser elevated voltage levels may be derived from the fully elevated voltage level provided by the voltage pump.

As mentioned above, in the signaling embodiment of FIG. 3, the actual access of the targeted storage cell occurs after time T6. Here, as observed in FIG. 3, after time T6, the select gate drain and select gate source nodes of the storage cell stack having the targeted storage cell (SGD/SGS_SEL 304/305) have reached their full voltage level of 3 to 4 times VCC and activate the respective select gate drain and select gate source transistors of the storage cell stack having the targeted storage cell. Additionally, the word lines that are not coupled to the targeted storage cell (WL_DESEL 302) have reached their full voltage level of 4 to 5 times VCC. With the SGD/SGS_SEL 304/305 and WL_DESEL 302 nodes having reached their full potential, a low resistance channel is established between the targeted storage cell and the bit line (BL 204) along the storage cell stack having the targeted storage cell. Also by time T6, the word line that is coupled to the targeted storage cell (WL_SEL 303) is at a low level to enable actual access to the targeted storage cell.

Furthermore, after time T6, each of the other nodes that are associated with the unselected or non-targeted storage cells, SGD_SUBBLK 306, SGS_DESEL 307 and SGD_DESEL 308 are at a low level which effectively keeps off the respective select gate drain transistors of all storage cell stacks that do not contain the targeted storage cell, and, keeps off all select gate source transistors of all storage cell stacks within those sub-blocks that do not contain the targeted storage cell. These signal states effectively decouple the bit line BL 204 from all storage cell stacks within the block that do not contain the targeted storage cell.

As can be seen from FIG. 3, each of the WL_SEL/ WL_DESEL 303/302, SGS/SGD_SEL 304/305, and SGD_SUBBLK 306 signals are subject to particular changes at particular times leading up to time T6. A discussion of the strategy associated with these waveforms immediately follows.

A challenge is accessing the storage cell in a short amount of time while also ensuring that only the targeted storage cell and/or its storage cell stack column is accessed (i.e., all non-targeted storage cell stacks are not accessed). With the sharing of some nodes across multiple storage cell stacks, such as the word lines, there exists the detrimental timing effects of the parasitic capacitances associated with each stack that a word line is coupled to. That is, the more storage cell stacks that a particular word line is coupled to, the greater the parasitic capacitance associated with the word line and the more difficult it becomes to drive a word line to the highest level voltage from the charge pump circuit.

As such, as observed in FIG. 3, both of the SGD_SUBBLK 306 and SGS_DESEL 307 nodes are driven to a low level much earlier in the control signal access sequence. Specifically, whereas the targeted storage cell is accessed after T6, note that the SGD_SUBBLK 306 and SGS_DESEL 307 nodes are driven to a de-activated low level at time T3. The deactivation of the SGD_SUBBLK 306 and SGS_DESEL 307 nodes at time T3 greatly diminishes or otherwise eliminates, over the time period from T3 to T6, the parasitic capacitances associated with all storage cell stacks in the block except the targeted storage cell stack and its sibling stacks that it shares the same select gate source node with.

However because the targeted storage cell stack is ultimately to be coupled, through the unselected word lines, to the fully elevated voltage level of 4 to 5 times VCC, there exists a potential danger in deactivating the SGD_SUBBLK 306 and SGS_DESEL 307 nodes too early in the voltage pumping process. Specifically, once the non-selected storage cell stacks are fully decoupled by way of the deactivation of the SGD_SUBBLK 306 and SGS_DESEL 307 signals, the potential of these columns themselves will rise in response to the voltage pumping activity that exists on the word lines. This characteristic is shown in FIG. 3 where the Unsel_Subblk Pillar Potential 309 is shown to rise in step with the voltage pumping of V_PASSOUT 301 after time T3.

If the SGD_SUBBLK 306 and SGS_DESEL 307 nodes were to be deactivated much earlier in the control signaling sequence, such as at time T1, the pillar potential 309 could rise as high as the maximum of V_PASSOUT itself (e.g., 4 to 5 times VCC) which could cause hot electron induced data corruption errors in the storage cells of the unselected columns. As such, there is a balance between how soon the unselected columns can be decoupled from the word lines to reduce their parasitic capacitance effects and how large their respective pillar voltages are allowed to rise once they are decoupled.

In the particular embodiment of FIG. 3, the pillar voltages of the unselected columns rise to approximately 3 times VCC (at time T5) after they are decoupled at time T3. Here, 3 times VCC is deemed to be low enough to avoid the aforementioned undesirable hot electron effects, but perhaps if the column voltages were to rise any higher (with some margin) hot electron effects may become an issue. As such, T3 is determined to be the earliest the unselected columns may be capacitively decoupled so as to ensure no substantial hot electron effects occur.

Prior to T3, the SGD_SUBBLK 306 and SGS_DESEL 307 nodes are at a higher voltage level to turn the select gate drain and select gate source transistors of the unselected columns sufficiently on, which, in turn, keeps the word lines capacitively coupled to their respective column. The capacitive coupling of the word lines to the unselected columns, in turn, prevents the respective voltages of the unselected columns from rising in response to the voltage pumping activity of V_PASSOUT 301 (as observed in the Unsel_Subblk_Pillar_Potential 309 voltage from times T1 to T3).

Thus, at time T1, each of the WL_SEL/WL_DESEL 303/302, SGS/SGD_SEL 304/305, and SGD_SUBBLK 306 signals begin to rise to nominal VCC. After reaching VCC, at time T2, the voltage pump is engaged which causes each of the WL_SEL/WL_DESEL 303/302, SGS/SGD_SEL 304/305, and SGD_SUBBLK 306 signals to climb above VCC as they are being elevated by the voltage pump. The SGD_SUBBLK 306 and SGD_DESEL 308 signals are eventually clamped at a voltage of approximately 2×VCC. Then, at time T3, SGD_SUBBLK 306 and SGS_DESEL signals 307 are deactivated to capacitively decouple all unselected storage stacks other than the targeted stack and the stacks it shares the same select gate source node with.

The select gate drain transistors of the columns that share the same select gate source node as the targeted column (SGD_DESEL 308) are also clamped at 2×VCC but are not capacitively decoupled or deactivated at time T3 because the activation of the shared select gate source node minimizes the effect of any such attempted decoupling (the activation of the shared select gate source node keeps these columns capacitively coupled).

After time T3 the select gate source and the select gate drain nodes of the targeted column (SGD/SGS_SEL 305/304) ramp to and are clamped at a level of 3 to 4 times VCC to ensure the targeted column is accessible to the bit line. Likewise, the word lines are also ramped to the maximum voltage level (4 to 5 time VCC).

In order to more efficiently trigger the appropriate voltage signals described just above, in an embodiment, the output voltage of the voltage pump circuit (V_PASSOUT 301) is monitored and, when the pumped level reaches a certain threshold, the critical timing points described above are recognized. In particular, time T3 is identified when the pumped voltage reaches a level of VGS_DESEL_INIT 310. Here, as can be seen from FIG. 3, when the pumped voltage reaches the VGS_DESEL_INIT level 310, the SGD_SUBBLK 306 and SGS_DESEL 307 nodes are deactivated in response (time T3 is recognized).

As the pumped voltage V_PASSOUT 301 continues to rise and reaches a level V_VWLRV_START 311, the selected select gate drain and select gate source nodes (SGD/SGS_SEL 305/304) are understood to be close to reaching their clamped 3 to 4 times VCC level, and, the word lines are understood to be close to reaching their 4 to 5 times VCC level (time T4 is reached). At this point, the word line that is coupled to the targeted storage cell (WL_SEL 303) begins to ramp down to a low voltage level so that the targeted storage cell can be accessed.

A short time later, when the pumped voltage V_PASSOUT 301 reaches V_PASSOUT_DET 312, the select gate drain and select gate source node voltages for the targeted column and the word lines have reached their desired voltages. As such, the select gate drain nodes of the columns that share the same select gate source node as the targeted column (SGD_DESEL 308) are deactivated (time T5 is reached). At this point, the block is "setup" to access the targeted storage cell at time T6. Here, in the case of a read of the targeted storage cell, once the targeted cell is accessed, charge stored by the cell that is indicative of a logic 1 or 0 causes more or less current to flow through the cell's column and bit line. A sense amplifier that is coupled to the bit line then senses whether the storage cell is storing a 1 or a 0 based on the amount of flowing current.

In an alternate embodiment having a signaling scheme that is different than the signaling scheme that is observed in FIG. 3, each of the control voltage waveforms observed in FIG. 3 are applied with the exception of the SGS_DESEL 307 signal. Here, as observed in FIG. 3 and as discussed above, SGS_DESEL 307 and SGD_SUBBLK 306 begins to be lowered once V_PASSOUT 310 reaches a level of VSGS_DESEL_INIT 310. In alternate embodiment, detection of the VSGS_DESEL_INIT level 310 is not performed and the lowering of SGS_DESEL 307 and SGD_SUBBLK 306 is triggered at T4 with the detection of V_PASSOUT 301 reaching the V_VWLRV_START level 311. Additionally, SGS_DESEL 307 may be clamped at approximately 2 times VCC similarly to SGD_SUBBLK 306 and SGD_DESEL 308.

Figure 4:
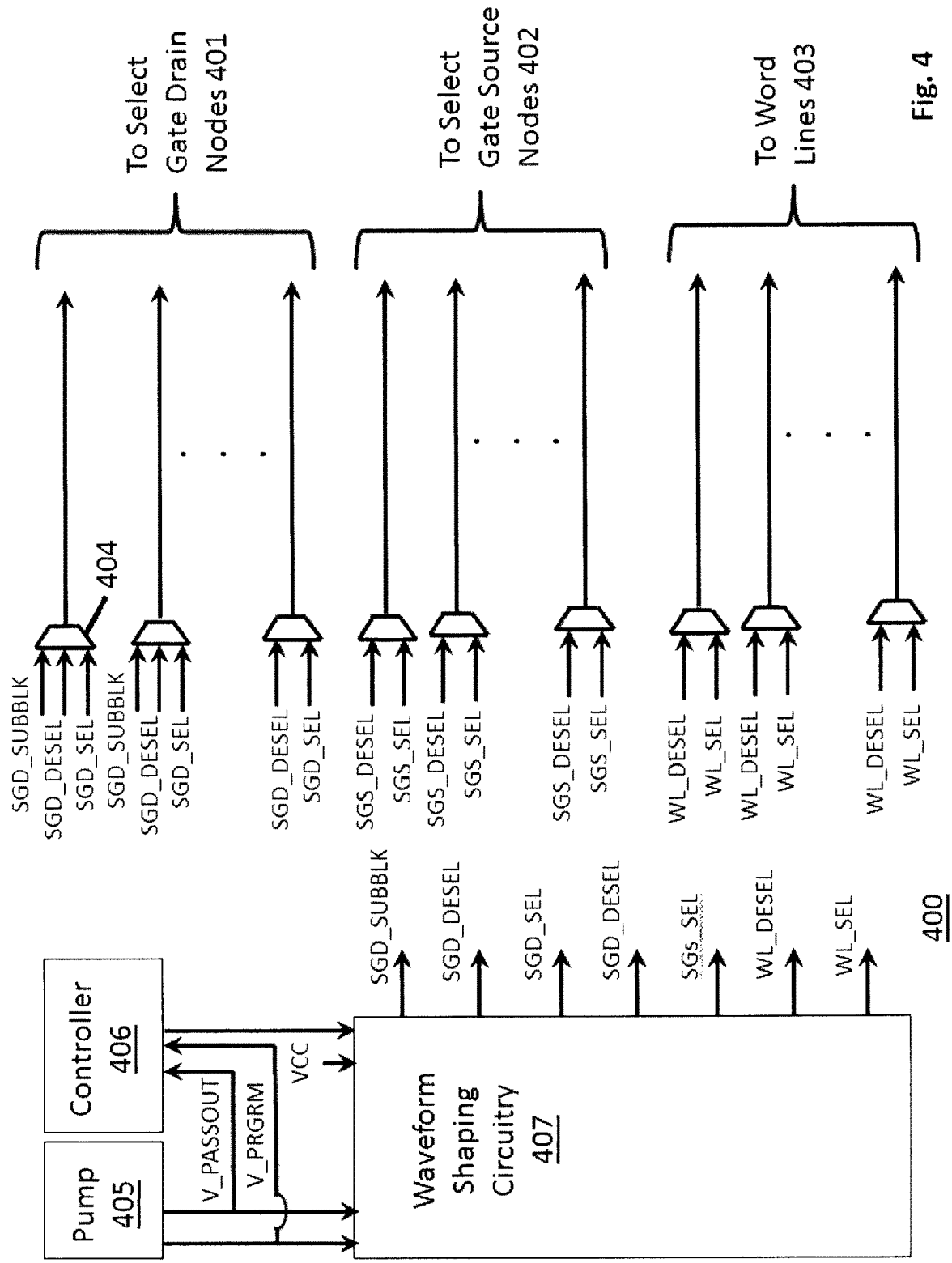
FIG. 4 shows an embodiment of an access signaling circuit that provides access signals and triggers signaling activity from output levels of a voltage pump.

FIG. 4 shows circuitry 400 that can be integrated on a memory having a three dimensional storage cell array such as any of the three dimensional storage cell array embodiments described above with respect to FIGS. 1 through 3. The depicted circuitry 400 of FIG. 4 can be integrated with the block circuitry and associated signal diagrams of FIGS. 2 and 3 specifically. Here, recall that FIGS. 2 and 3 described the existence of seven different control signals: SGD_SUB-BLK, SGD_DESEL, SGD_SEL, SGS_DESEL, SGS_SEL, WL_DESEL and WL_SEL. FIG. 4 shows circuitry to generate each of these individual signals.

As observed in FIG. 4, a first set of control signal lines 401 run to each select gate drain transistor of each storage column, a second set of control signal lines 402 run to each of the shared select gate source node that defines the existence of a sub-block and a third set of control signal lines 403 run to each of the different word lines. Here, again consistent with the discussion above of FIGS. 2 and 3, depending on which specific storage cell is being targeted, different ones of the select gate drain transistors will receive any one of the SGD_SUBBLK, SGD_DESEL and SGD_SEL signals. As such, each individual select gate transistor that is respectively coupled to each storage cell stack has its gate node driven by a multiplexer 404 that receives each of these three signals (for illustrative ease, only one such multiplexer is labeled). In an embodiment, which one of these signals that is selected by each individual multiplexer is determined by an address decoder that effectively causes each multiplexer to select the correct one of these signals based on which storage cell is being targeted. That is, the respective channel select inputs of the multiplexers is driven by an address decoder.

Similarly, different individual ones of the shared select gate source nodes 402 are driven by their own respective multiplexers that each receive the SGS_DESEL and SGS_SEL signals. In an embodiment, which one of these signals that is selected by each individual multiplexer is determined by an address decoder that effectively causes each multiplexer to select the correct one of these signals based on which storage cell is being targeted. Finally, different ones of the word lines 403 are driven by their own respective multiplexers that each receive the WL_DESEL and WL_SEL signals. In an embodiment, which one of these signals that is selected by each individual multiplexer is determined by an address decoder that effectively causes each multiplexer to select the correct one of these signals based on which storage cell is being targeted.

Also, as discussed above with respect to FIGS. 2 and 3, in an embodiment, the timing of when various ones of the aforementioned signals change levels is determined from the output voltage level of a voltage pump circuit 405 whose voltage output level also drives the various voltage levels of the control signals themselves.

As observed in FIG. 4, the circuitry 400 includes the aforementioned pump circuit 405, a controller circuit 406 and waveform shaping circuitry 407. The waveform shaping circuitry 407 crafts the voltages of the individual control signals from the VCC voltage level and the output of the voltage pump circuit (V_PASSOUT), and, induces deliberate changes in the voltage levels of the individual control signals at appropriate times under direction from the controller 406. Likewise, as discussed above, the controller 406 itself understands that changes in certain control signals are appropriate based on the V_PASSOUT level from the voltage pump circuit. As such, as observed in FIG. 4, the controller 406 receives the V_PASSOUT voltage as an input and provides control/direction to the waveform shaping circuitry 407. The controller may be implemented in various ways such as a dedicated state machine circuit, an embedded processor that executes program code or some combination of dedicated state machine circuitry and embedded processor. The controller in various embodiments also has associated analog-to-digital converters at its inputs where it receives V_PASSOUT and V_PRGRM (discussed further below) so it can process a digital representation of these voltage levels.

FIG. 4 also shows that the pumping circuitry 405 can also generate a program voltage (V_PRGRM) along with the V_PASSOUT voltage. In various embodiments where V_PASSOUT is, e.g., 4 to 5 times VCC, V_PRGRM may reach even higher voltages of, e.g., 5 to 6 times VCC. Whereas the specific signaling of FIG. 3 is directed to a read operation, in the case of a write operation, the signaling associated with FIG. 3 may be performed but the selected word line (WL_SEL) is driven to the even larger V_PRGRM voltage rather than being lowered to approximately 0.5 times VCC as observed in FIG. 3 (the unselected word lines still receive the full V_PASSOUT voltage). Here, in the case of a write operation, after the unselected word lines receive the V_PASSOUT voltage 301 and the selected word line receives the higher V_PRGRM voltage, a voltage that is indicative of a logic 1 or 0 is placed on the bit line BL and a corresponding amount of charge is stored in the targeted storage cell.

Figure 5:
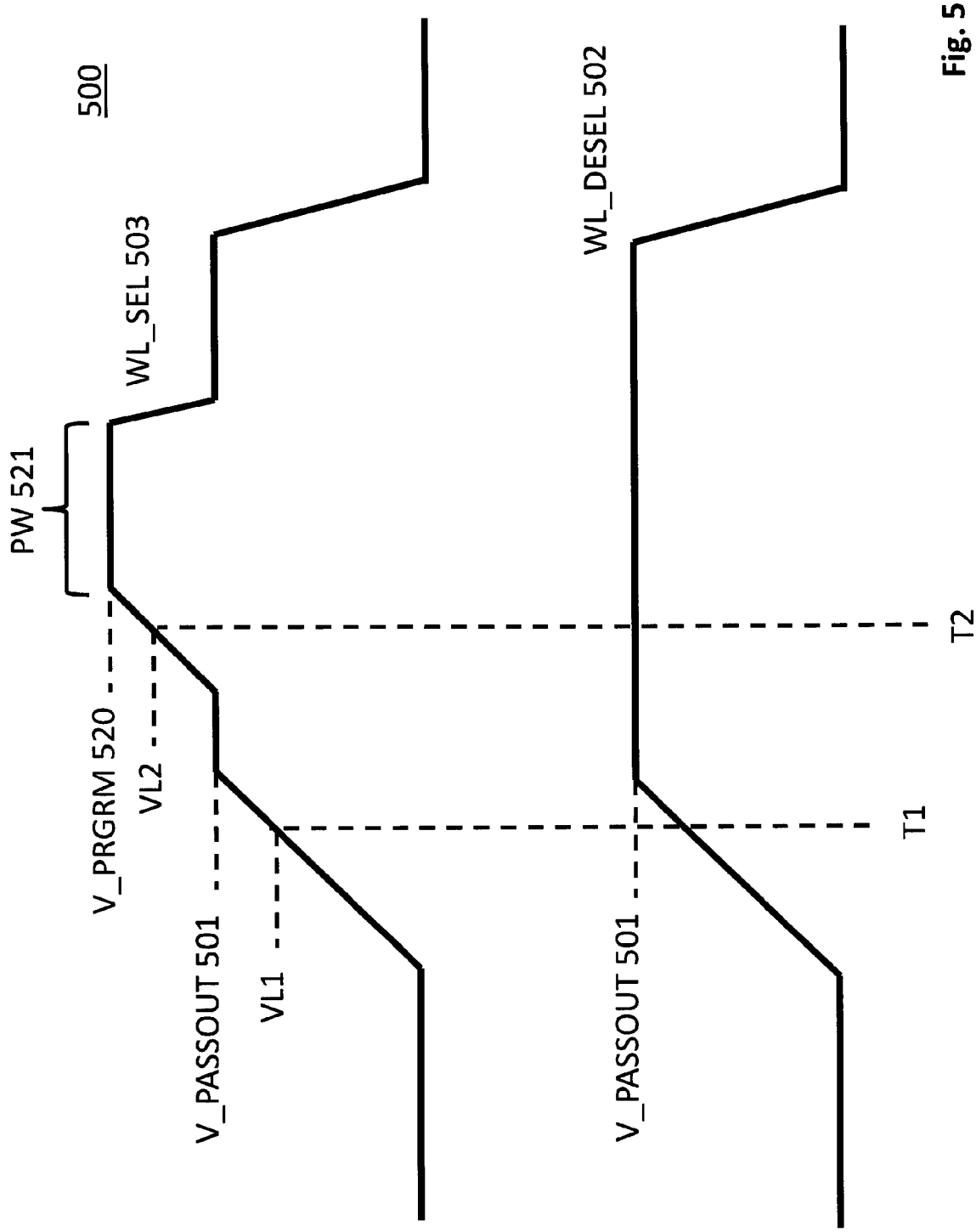
FIG. 5 shows an embodiment of an improved three dimensional NAND programming signaling approach that triggers signaling activity for a program operation from output levels of a voltage pump.

FIG. 5 shows an embodiment of the signaling waveforms for both the selected word line and the unselected word lines for the aforementioned write operation. Here, as with the exemplary read operation of FIG. 3, the voltage level of V_PASSOUT may be monitored to assist in the crafting of the WL_SEL waveform. In particular, as observed in FIG. 5, when V_PASSOUT 501 reaches a level of VL1 (which may be less than or equal to the full V_PASSOUT voltage 501, but, in various embodiments, can be greater than the full V_PASSOUT voltage if there is a voltage drop from the voltage pump output terminal to the selected word line), the portion of the pumping circuit 405 that generates V_PRGRM 520 is initiated to begin pumping of the V_PRGRM voltage 520. Here, the level VL1 of V_PASSOUT 501 that is used to trigger the start of the V_PRGRM pumping activity is based on an understanding of how fast V_PRGRM 520 can be pumped to its desired level in view of the overall write operation. FIG. 5 also shows that V_PRGRM 520 can also be monitored, and, when it reaches a level VL2 other actions may be triggered such as starting a timer that controls the pulsewidth PW 521 of the V_PRGRM level 520 of the WL_SEL signal 503. As such, FIG. 4 shows not only V_PASSOUT 501 being fed to the controller but also V_PRGRM 520.

Figure 6:
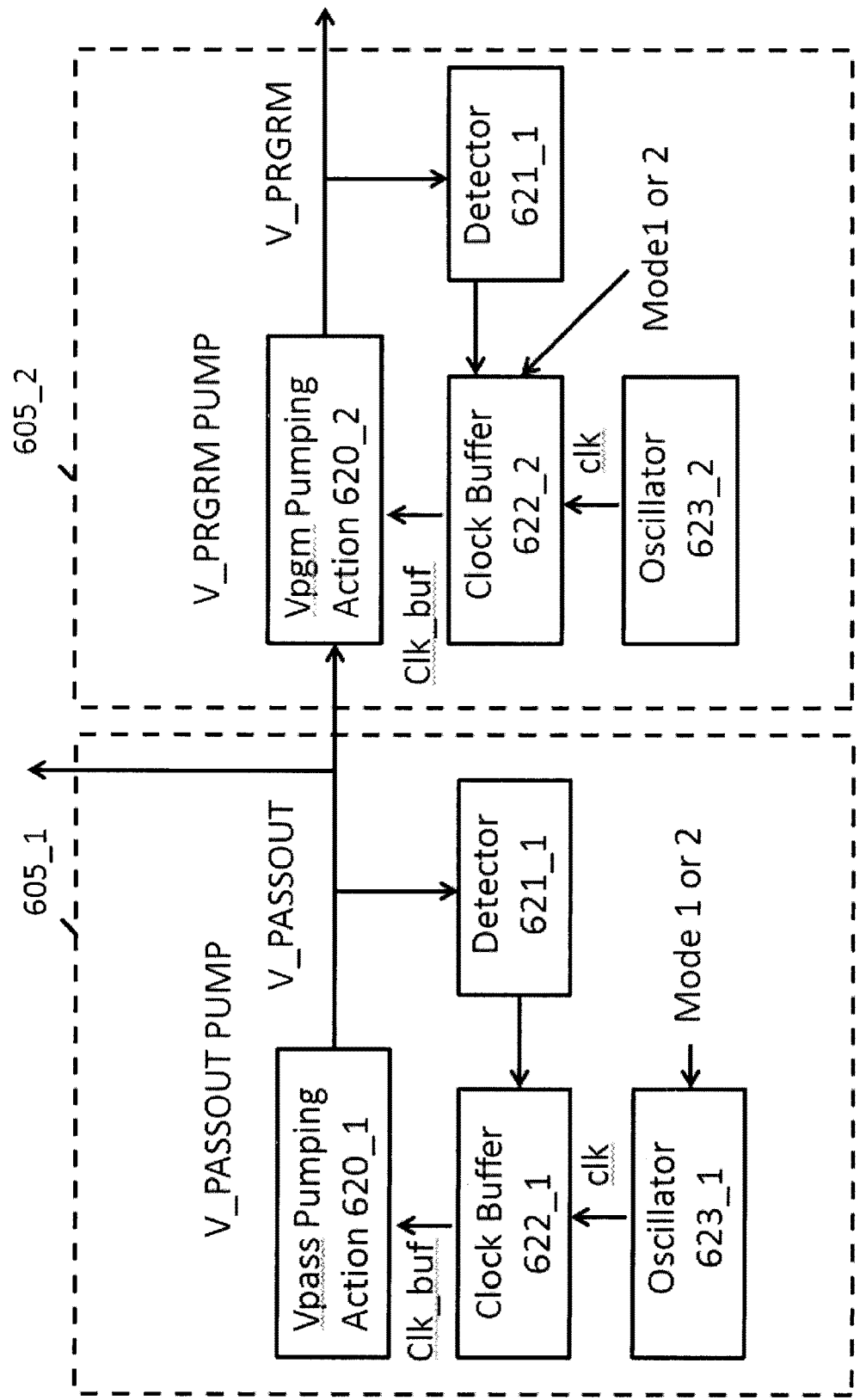
FIG. 6 shows an embodiment of a circuit diagram for a voltage pump circuit.
Figure 7A:
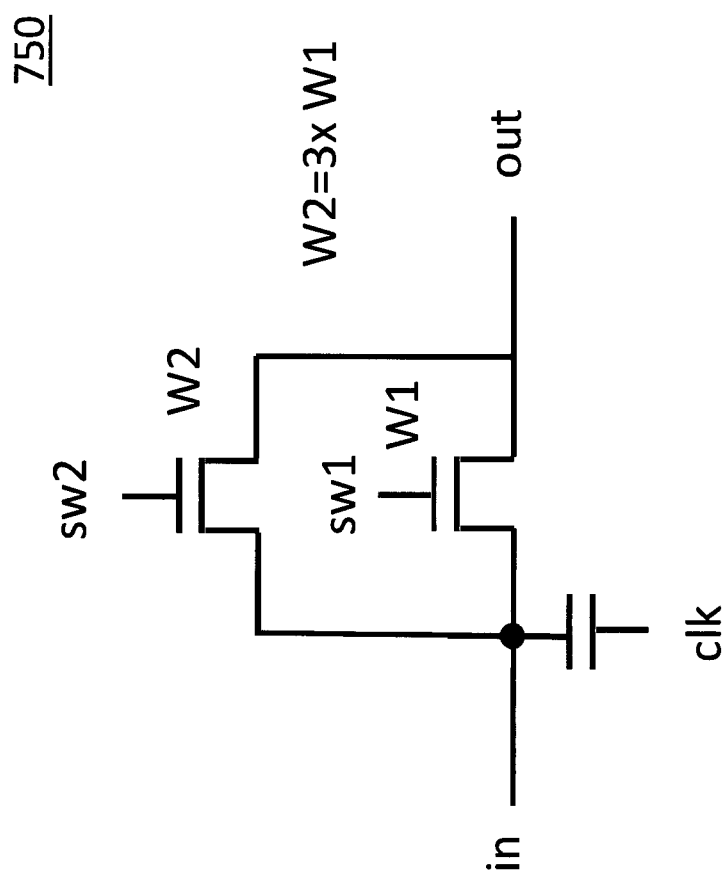
FIG. 7a shows an embodiment of a unit cell voltage pump circuit.

FIGS. 6 and 7a,b pertain to possible embodiments of the pumping circuitry for generating both the V_PASSOUT and V_PRGRM voltages. FIG. 6 shows a pumping circuit embodiment 605 in which two different pump circuits 605_1, 605_2 are utilized: a first voltage pumping circuit 605_1 that generates V_PASSOUT and a second voltage pumping circuit 605_2 that generates V_PRGRM. As observed in FIG. 6, both circuits 605_1, 605_2 include a pumping action circuit 620, a feedback detector 621, a clock buffer 622 and an oscillator 623. Here, although the feedback detector 621 could be used to also perform the aforementioned V_PASSOUT/V_PRGRM detections that trigger control signal waveform shaping actions, it is not a requirement that they do so. That is, other detectors (e.g., at the front end of the controller) could be used for this purpose.

When a clock signal is applied to the pumping action circuit 620, the pumping action circuit 620 pumps the output voltage to a higher voltage level. The detector 621 monitors the pumped output voltage and causes the clock buffer 622 to pass the clock signal to the pumping action circuit 620 if the output voltage is below the targeted voltage. Thus, the clock buffer circuit 622_1 of the V_PASSOUT circuit 605_1 will pass a clock signal to the pumping action circuit 620_1 when the output voltage is beneath V_PASSOUT, and, will alternatively pass a clock signal and deny passing of the clock signal to the pumping action circuit 620_1 when the output voltage has reached V_PASSOUT in order to keep the output voltage stable at V_PASSOUT. The same principle of operation also applies to the V_PRGRM pump circuit 605_2 except that the targeted output voltage is V_PRGRM rather than V_PASSOUT.

In an embodiment, both of the pump circuits operate 605_1, 605_2 with two different frequencies, a first higher frequency (f1) used to pump the output voltage to its desired voltage and a second lower frequency (f2) used to keep the output voltage stable once it reaches its desired level. Thus, each pump circuit 605_1, 605_2 has two modes, a first mode used to pump the output voltage to its desired level and a second mode used to keep the desired output voltage stable at the output. Here, as is known in the art, a pumping action circuit 620 effectively converts a time varying signal into a charge pump that can pump a node to a higher voltage level.

In an embodiment, the manner in which the pair of pump circuits 605_1, 605_2 incorporate the two different frequencies is different. Specifically, the V_PASSOUT pump circuit 605_1 provides either of the two different frequency signals to the clock buffer circuit 622_1 whereas the V_PRGRM pump circuit 605_2 generates either of the two different frequencies internally within the clock buffer 622_2 from a single clock source. The two different frequency approaches as between the two circuits 605_1, 605_2 is a consequence of the different amount of voltage pumping that needs to be performed by the two circuits 605_1, 605_2.

Here, the V_PASSOUT pump circuit 605_1 generally pumps to a larger amount of charge/voltage than the V_PRGRM pump circuit 605_2. That is, the V_PASSOUT pump circuit 605_1 may need to pump from, e.g., a VCC level to a level that is 3 or 4 times VCC beyond VCC. By contrast, the V_PRGRM circuit 605_2 may need to only pump from V_PASSOUT to 1 or 2 times VCC beyond V_PASSOUT. As such, whereas the V_PASSOUT circuit 605_1 may need to rapidly pump 3 to 4 times VCC, by contrast, the V_PRGRM circuit 605_2 may need to only pump 1 or 2 times VCC. As such, there is greater disparity within the two circuits between the frequency used to pump the output voltage higher.

Figure 7B:
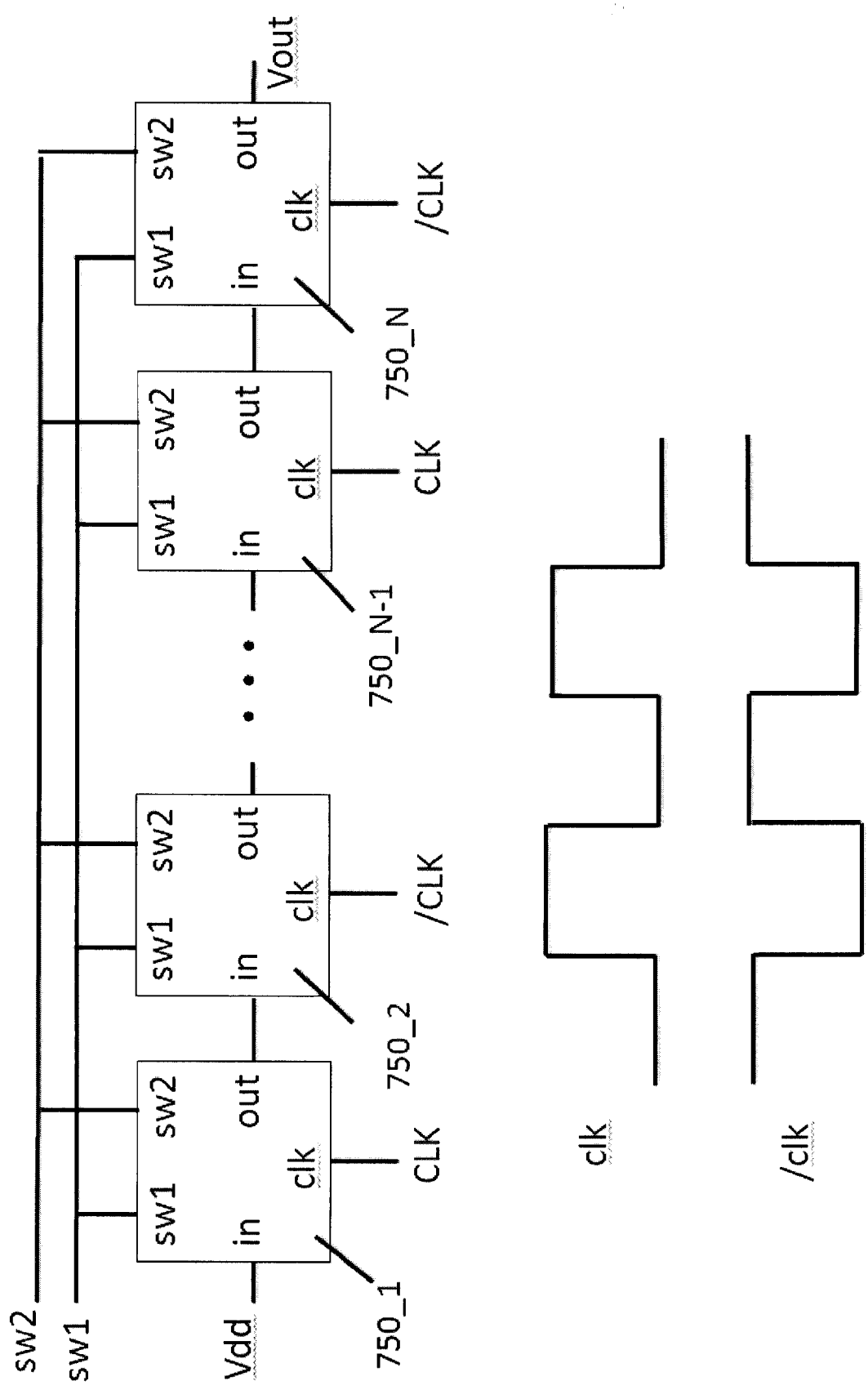
FIG. 7b shows an embodiment of a voltage pump circuit constructed from a series chain of unit cell voltage pump circuits.

In an embodiment, the clock buffer 622_2 of the V_PRGRM circuit 605_2 has a clock divider that uses one half the source frequency when keeping the output stable and uses the faster, undivided source frequency when pumping the output voltage to V_PRGRM. By contrast, the V_PASSOUT circuit 605_1 uses two different frequencies that are more than a factor of 2 and may even be a non-integer multiple from the lower frequency to the higher frequency FIGS. 7a and 7b show embodiments of circuitry that may be used to implement the pumping action circuitry of either of the pump circuits 605_1, 605_2 of FIG. 6. FIG. 7a shows a unit cell circuit 750 having first and second transistors SW1 and SW2 whose channel resistance can affect the pumping activity/rate of the pumping action circuit.

In an embodiment, in the aforementioned higher frequency pumping mode, both of the SW1 and SW2 transistors are "on" which decreases the total resistance along the current path(s) from the capacitor to the output. Here, the decreased resistance corresponds to faster pumping action. By contrast, in the aforementioned lower frequency pumping mode, only the SW1 transistor is "on" which increases the current path resistance and, correspondingly, reduces the pumping action (which is more suitable for keeping the output voltage stable). In a further embodiment, the SW2 transistor is larger (e.g., three times larger) than the SW1 transistor to cause greater disparity in the current path resistances as between the two modes, and, correspondingly, induce greater pumping action disparity as between the two modes.

Here, because the SW2 transistor is not enabled in the lower frequency pumping mode, the power efficiency of the pump increases in comparison with the higher frequency mode where both of the SW1 and SW2 transistors are enabled. That is, in either mode, the parasitic capacitance of the enabled switch/switches is charged and discharged at every clock period which consumes power. In the lower frequency mode having only one enabled switch transistor (SW1), the parasitic capacitance of the switching component (SW1) is less than the parasitic capacitance of the switching component in the higher frequency mode (SW1+SW2). As a result, the circuit has improved average power consumption when keeping the pumped voltage stable which improves the average power consumption of the pumping action overall.

FIG. 7b shows a complete pumping action circuit constructed from a chain of unit cell circuits. Here, unit cell circuits 750_1 through 750_N are coupled in series so that the pumping action of an immediately following cell will operate on the pumping action of an immediately preceding cell. As observed in FIG. 7b, a first cell receives a first clock signal CLK and a second cell receives a second clock/CLK that is 180° out of phase with the first clock signal CLK. During the first logic high half cycle of the first clock CLK, the first cell performs pumping action on its input voltage and provides a pumped up voltage at its output node. During the immediately following logic high half cycle of the second clock/CLK, the second immediately following cell performs pumping action on the voltage provided by the first cell. As such, an incrementally higher pumped up voltage ripples through the cell chain with each half cycle of the core frequency of the clock signals. Here, multiple instances of the circuit of FIG. 7b can be chained in series to reach higher pumped up voltage amplitudes.

In various embodiments, when the pumping action circuit is in the first higher frequency mode, each of the cells receive the higher frequency clock (with alternating cells in the series chain receiving a clock signal of same phase) and all cells in the chain are activated. By contrast, when the pumping action circuit is in the second lower frequency mode, each of the cells receive the lower frequency clock (with alternating cells in the series chain receiving a clock signal of same phase) and all cells in the chain are activated. In an alternate lower frequency mode embodiment, less than all of the cells in the chain are activated. For example, the pumped voltage output in the second mode may be tapped from the midpoint of the chain and all following cells downstream in the chain do not receive any clock to further improve the power efficiency in the second mode.

FIG. 8 shows an embodiment of an improved reset signaling approach 800. Here, the improved signaling approach is shown over time instances T7 through T9 which continue from the improved read process of FIG. 3. The reset operation can therefore follow, e.g., a read operation. As observed at time T7, both the selected and unselected word lines (WL_SEL/DESEL 803/802) are set to a same voltage of approximately 2 to 3 times VCC. Setting each of the word lines to a same voltage reduces the body potential of the floating (deselected) storage cell stacks. As a result, hole/electron pair generation due to high electric fields can be eliminated in the deselected sub-blocks while keeping the selected sub-block turned on. At time T8, the remaining signal lines are also set to 2 to 3 times VCC which has the effect of discharging the unselected storage cell stacks and, in the selected storage cell stack, resetting the selected cell but not the other cells. At time T9 all signal lines are set to the ground reference potential after the reset occurs between times T8 and T9.

It is important to point out that the voltage levels, number of storage cells per column, number of columns having shared nodes, etc. are only exemplary and may vary from embodiment to embodiment.

Figure 9:
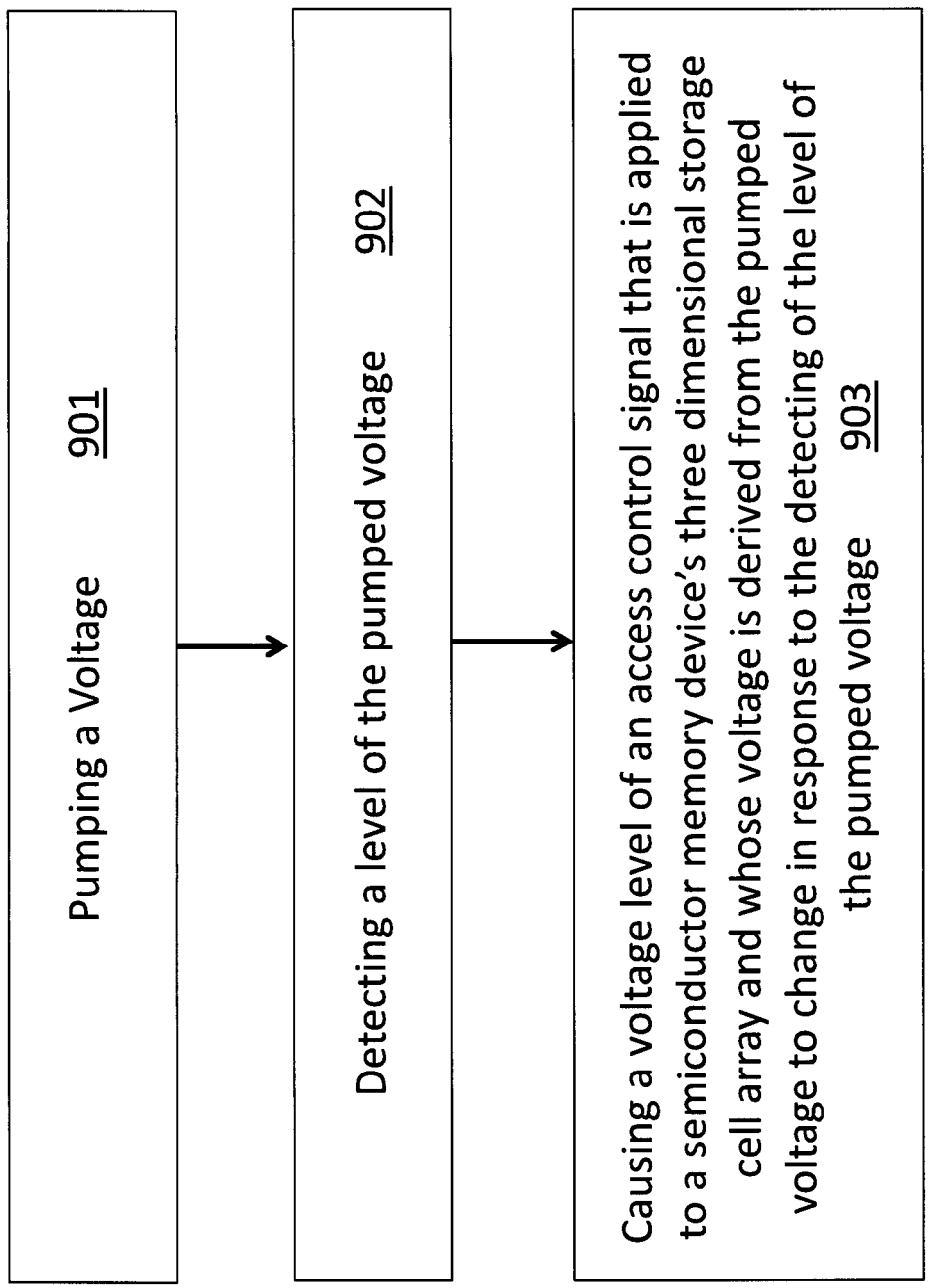
FIG. 9 shows an embodiment of a signaling method for a three dimensional NAND FLASH.

FIG. 9 shows a method that has been described above. The method of FIG. 9 includes pumping a voltage 901. The method also includes detecting a level of the pumped voltage 902. The method also includes causing a voltage level of an access control signal that is applied to a semiconductor memory device's three dimensional storage cell array and whose voltage is derived from the pumped voltage to change in response to the detecting of the level of the pumped voltage 903.

Figure 10:
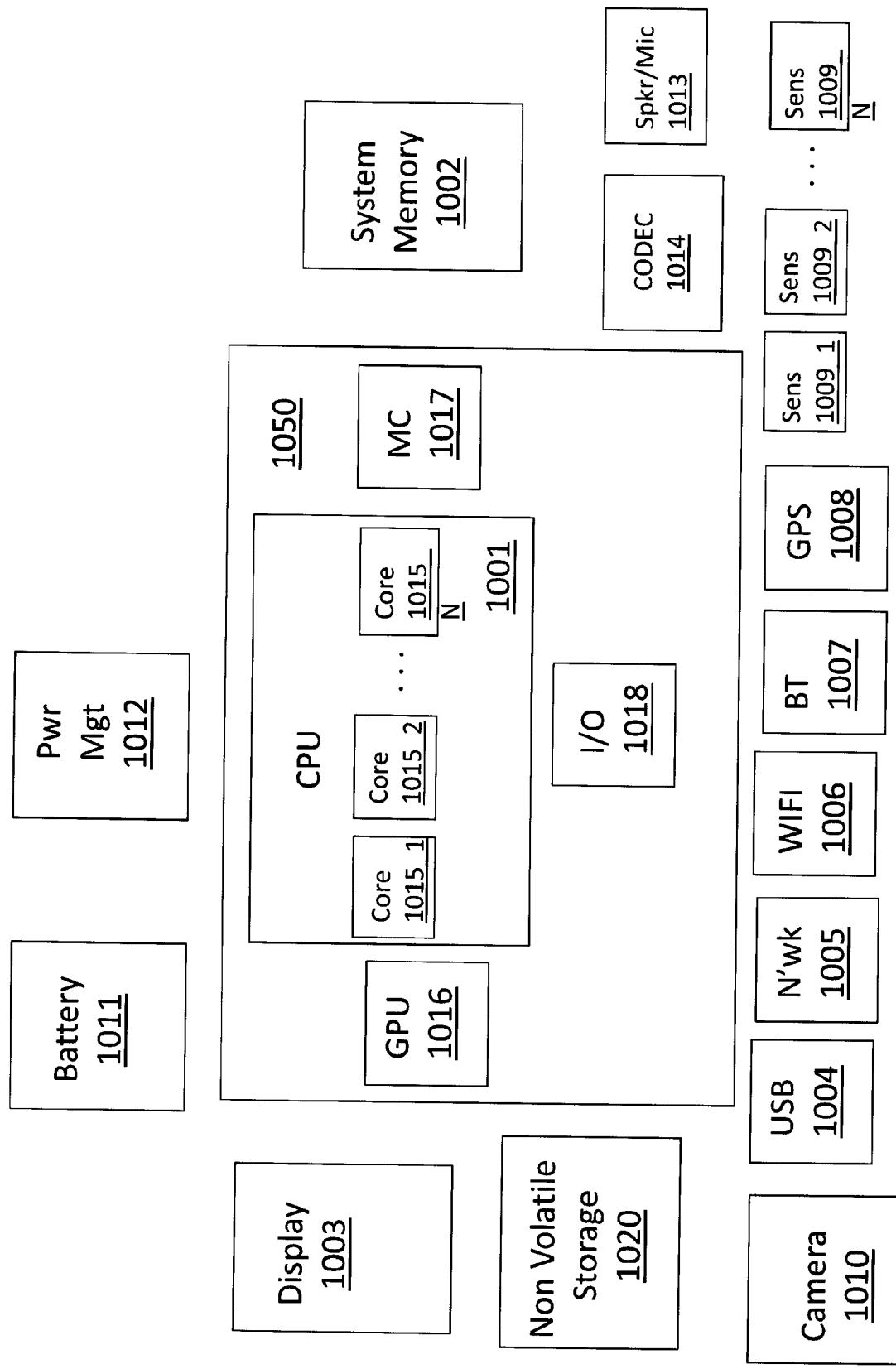
FIG. 10 shows an embodiment of a computing system.

FIG. 10 shows a depiction of an exemplary computing system 1000 such as a personal computing system (e.g., desktop or laptop) or a mobile or handheld computing system such as a tablet device or smartphone, or, a larger computing system such as a server computing system. As observed in FIG. 10, the basic computing system may include a central processing unit 1001 (which may include, e.g., a plurality of general purpose processing cores and a main memory controller disposed on an applications processor or multi-core processor), system memory 1002, a display 1003 (e.g., touchscreen, flat-panel), a local wired point-to-point link (e.g., USB) interface 1004, various network I/O functions 1005 (such as an Ethernet interface and/or cellular modem subsystem), a wireless local area network (e.g., WiFi) interface 1006, a wireless point-to-point link (e.g., Bluetooth) interface 1007 and a Global Positioning System interface 1008, various sensors 1009_1 through 1009_N (e.g., one or more of a gyroscope, an accelerometer, a magnetometer, a temperature sensor, a pressure sensor, a humidity sensor, etc.), a camera 1010, a battery 1011, a power management control unit 1012, a speaker and microphone 1013 and an audio coder/decoder 1014.

An applications processor or multi-core processor 1050 may include one or more general purpose processing cores 1015 within its CPU 1001, one or more graphical processing units 1016, a memory management function 1017 (e.g., a memory controller) and an I/O control function 1018. The general purpose processing cores 1015 typically execute the operating system and application software of the computing system. The graphics processing units 1016 typically execute graphics intensive functions to, e.g., generate graphics information that is presented on the display 1003. The memory control function 1017 interfaces with the system memory 1002.

The system memory 1002 may be a multi-level system memory having, e.g., a first level having faster access times than a second lower level. The second lower level may be implemented with a three-dimensional storage technology having any of the signaling approaches discussed at length above and corresponding circuitry. Alternatively or in combination, the three-dimensional storage technology having the any of the signaling approaches described at length above may be implemented as a more traditional non volatile storage such as a solid state disk (SSD) replacement for a traditional hard disk drive and/or BIOS memory.

Each of the touchscreen display 1003, the communication interfaces 1004-1007, the GPS interface 1008, the sensors 1009, the camera 1010, and the speaker/microphone codec 1013, 1014 all can be viewed as various forms of I/O (input and/or output) relative to the overall computing system including, where appropriate, an integrated peripheral device as well (e.g., the camera 1010). Depending on implementation, various ones of these I/O components may be integrated on the applications processor/multi-core processor 1050 or may be located off the die or outside the package of the applications processor/multi-core processor 1050.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
  a semiconductor memory device comprising a three dimensional storage cell array, the semiconductor memory device comprising:
  a) a voltage pumping circuit to produce a pumped voltage;
  b) a waveform shaping circuit coupled to the voltage pumping circuit, the waveform shaping circuit to create access control signals to be applied to the three dimensional storage cell array, the access control signals having voltage levels derived from the pumped voltage;
  c) a digital controller circuit having an input to detect one or more levels of the pumped voltage, the digital controller circuit having an output coupled to an input of the waveform shaping circuit, the digital controller circuit to cause the waveform shaping circuit to change voltage levels in the access control signals based on the one or more levels of the pumped voltage, the change of the voltage levels in the access control signals based on the one or more levels of the pumped voltage comprising:
    i) ramping up respective voltages of each of select gate drain nodes of sub-blocks that do not contain a targeted storage cell, select gate source nodes of the sub-blocks that do not contain the targeted storage cell and select gate drain nodes of storage cell stacks that do not contain the targeted storage cell but reside within a sub-block that contains the targeted storage cell in response to the pumped voltage ramping down toward a low voltage level;
    ii) ramping down the respective voltages of the select gate drain nodes of the sub-blocks that do not contain the targeted storage cell and the select gate source nodes of the sub-blocks that do not contain the targeted storage cell but not the select gate drain nodes of storage cell stacks that do not contain the targeted storage cell but reside within the sub-block that contains the targeted storage cell in response to the pumped voltage ramping up to a first voltage level above the low voltage level;
    iii) ramping up the voltage of the select gate drain nodes of the storage cell stacks that do not contain the targeted storage cell but reside within the sub-block that contains the targeted storage cell in response to the pumped voltage ramping up to a second voltage level that is higher than the first voltage level.

2. The apparatus of claim 1 wherein the semiconductor memory device is a NAND FLASH semiconductor memory device.

3. The apparatus of claim 1 wherein the digital controller circuit is to, during a read operation, based on the one or more levels of the pumped voltage, cause an access control signal of the access control signals to initially prevent unselected storage cell column potential from increasing so as to substantially prevent detrimental high energy effects within the unselected storage cell column and then cause the access control signal to permit potential to increase in the unselected storage cell column to reduce the unselected storage cell column's parasitic capacitance.

4. The apparatus of claim 1 wherein the digital controller circuit is to, during a read operation, based on the one or more levels of the pumped voltage, cause unselected word lines and a selected word line to follow different voltage level paths.

5. The apparatus of claim 1 wherein the digital controller circuit is to, during a read operation, based on the one or more levels of the pumped voltage, cause a node that is shared between a selected storage cell column and multiple unselected storage cell columns to change voltage levels.

6. The apparatus of claim 1 wherein the digital controller circuit is to, during a write operation, based on the one or more levels of the pumped voltage, determine when a program voltage is to begin pumping.

7. The apparatus of claim 6 wherein the digital controller circuit is to, during the write operation, based on a detected level of the program voltage, start a timer that determines how long the program voltage will be applied to the three dimensional storage cell array.

8. The apparatus of claim 6 further comprising a second voltage pumping circuit to produce the program voltage, the second voltage pumping circuit comprising a high frequency mode and a low frequency mode, the high frequency mode to pump the program voltage to its desired level, the low frequency mode to keep the program voltage stable, the second voltage pumping circuit having a clock buffer circuit to establish the respective frequencies of the low frequency mode and the high frequency mode.

9. The apparatus of claim 1 wherein the voltage pumping circuit has a high frequency mode and a low frequency mode, the high frequency mode to pump the pumped voltage to its desired level, the low frequency mode to keep the pumped voltage stable.

10. The apparatus of claim 9 wherein the voltage pumping circuit is to operate the low frequency mode from a first oscillator frequency and operate the high frequency mode from a second oscillator frequency.

11. The apparatus of claim 1 wherein the voltage pumping circuit comprises a pumping action circuit, the pumping action circuit comprising a series chain of unit cell pumping action circuits, each of the unit cell pumping action circuits comprising a first mode and second mode that establish different internal resistance paths.

12. The apparatus of claim 1 wherein the digital controller circuit is to, during a reset operation, based on the one or more levels of the pumped voltage, cause multiple ones of the access control signals to reach a same voltage level.

13. A computing system, comprising: a plurality of processors;
a memory controller;
a system memory coupled to the memory controller; a networking interface;
a semiconductor memory device comprising a three dimensional storage cell array, the semiconductor memory device comprising:
a) a voltage pumping circuit to produce a pumped voltage;
b) a waveform shaping circuit coupled to the voltage pumping circuit, the waveform shaping circuit to create access control signals to be applied to the three dimensional storage cell array, the access control signals having voltage levels derived from the pumped voltage;
c) a digital controller circuit having an input to detect one or more levels of the pumped voltage, the digital controller circuit having an output coupled to an input of the waveform shaping circuit, the digital controller circuit to cause the waveform shaping circuit to change voltage levels in the access control signals based on the one or more levels of the pumped voltage, the change of the voltage levels in the access control signals based on the one or more levels of the pumped voltage comprising:
  i) ramping up respective voltages of each of select gate drain nodes of sub-blocks that do not contain a targeted storage cell, select gate source nodes of the sub-blocks that do not contain the targeted storage cell and select gate drain nodes of storage cell stacks that do not contain the targeted storage cell but reside within a sub-block that contains the targeted storage cell in response to the pumped voltage ramping down toward a low voltage level;
  ii) ramping down the respective voltages of the select gate drain nodes of the sub-blocks that do not contain the targeted storage cell and the select gate source nodes of the sub-blocks that do not contain the targeted storage cell but not the select gate drain nodes of storage cell stacks that do not contain the targeted storage cell but reside within the sub-block that contains the targeted storage cell in response to the pumped voltage ramping up to a first voltage level above the low voltage level;
  iii) ramping up the voltage of the select gate drain nodes of the storage cell stacks that do not contain the targeted storage cell but reside within the sub-block that contains the targeted storage cell in response to the pumped voltage ramping up to a second voltage level that is higher than the first voltage level.

14. The computing system of claim 13 wherein the semiconductor memory device is a NAND FLASH semiconductor memory device.

15. The computing system of claim 13 wherein the digital controller circuit is to, during a read operation, based on the one or more levels of the pumped voltage, cause an access control signal of the access control signals to initially prevent unselected storage cell column potential from increasing so as to substantially prevent detrimental high energy effects within the unselected storage cell column and then cause the access control signal to permit potential to increase in the unselected storage cell column to reduce the unselected storage cell column's parasitic capacitance.

16. The computing system of claim 13 wherein the digital controller circuit is to, during a read operation, based on the one or more levels of the pumped voltage, cause unselected word lines and a selected word line to follow different voltage level paths.

17. The computing system of claim 13 wherein the digital controller circuit is to, during a read operation, based on the one or more levels of the pumped voltage, cause a node that is shared between a selected storage cell column and multiple unselected storage cell columns to change voltage levels.

18. The computing system of claim 13 wherein the voltage pumping circuit has a high frequency mode and a low frequency mode, the high frequency mode to pump the pumped voltage to its desired level, the low frequency mode to keep the pumped voltage stable.

19. The computing system of claim 13 wherein the voltage pumping circuit comprises a pumping action circuit, the pumping action circuit comprising a series chain of unit cell pumping action circuits, each of the unit cell pumping action circuits comprising a first mode and second mode that establish different internal resistance paths.

20. The computing system of claim 13 wherein the semiconductor memory device is a component within a non-volatile storage system of the computing system.

21. A method, comprising:
within a semiconductor memory device comprising a three dimensional storage cell array:
pumping a voltage;
converting the pumped voltage into digital representations of the pumped voltage;
processing the digital representations of the pumped voltage with logic circuitry to detect a level of the pumped voltage;
causing a voltage level of an access control signal that is applied to the three dimensional storage cell array and whose voltage is derived from the pumped voltage to change in response to the detecting of the level of the pumped voltage, the access control signal being a signal that applies voltage to select gate drain nodes of sub-blocks that do not contain a targeted storage cell, the voltage level change being a ramping down of the access control signal, the level of the pumped voltage being less than a maximum level because the pumped voltage is ramping down to a low level.

22. The method of claim 21 wherein the access control signal is a selected word line access control signal.

23. The method of claim 21 wherein the access control signal is directed to multiple sub-blocks that each share a same select gate source node.

24. The method of claim 21 further comprising causing a second voltage level of a second access control signal that is applied to the three dimensional storage cell array and whose voltage is derived from the pumped voltage to change in response to the detecting of a second level of the pumped voltage, the second access control signal being a signal that applies voltage to select gate drain nodes of storage cell stacks that do not contain the targeted storage cell but reside within a sub-block that contains the targeted storage cell, the voltage level change of the second access control signal being a ramping down of the second access control signal, the level of the pumped voltage being between the maximum level and the low level because the pumped voltage is ramping up from the low level to the maximum level.

* * * * *